United States Patent
Cheng et al.

(10) Patent No.: US 9,269,792 B2
(45) Date of Patent: Feb. 23, 2016

(54) METHOD AND STRUCTURE FOR ROBUST FINFET REPLACEMENT METAL GATE INTEGRATION

(71) Applicant: International Business Machines Corporation, Armonk, NY (US)

(72) Inventors: Kangguo Cheng, Schenectady, NY (US); Shom S. Ponoth, Gaithersburg, MD (US); Raghavasimhan Sreenivasan, Schenectady, NY (US); Theodorus E. Standaert, Clifton Park, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 82 days.

(21) Appl. No.: 14/299,300

(22) Filed: Jun. 9, 2014

(65) Prior Publication Data

US 2015/0357440 A1 Dec. 10, 2015

(51) Int. Cl.
*H01L 29/78* (2006.01)
*H01L 29/66* (2006.01)

(52) U.S. Cl.
CPC ...... *H01L 29/66795* (2013.01); *H01L 29/6656* (2013.01); *H01L 29/66545* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 5,420,057 A | 5/1995 | Bennett et al. | |
| 7,271,049 B2 | 9/2007 | Gluschenkov et al. | |
| 7,820,552 B2 | 10/2010 | Kanakasabapathy et al. | |
| 7,872,303 B2 | 1/2011 | Chan et al. | |
| 8,143,663 B2 | 3/2012 | Jeong | |
| 8,193,099 B1 | 6/2012 | Khare et al. | |
| 2003/0178688 A1* | 9/2003 | Yang | H01L 21/31116 257/395 |
| 2003/0228766 A1* | 12/2003 | Chou | H01L 21/28044 438/694 |
| 2004/0198006 A1 | 10/2004 | Jeng | |
| 2006/0189058 A1* | 8/2006 | Lee | H01L 29/66795 438/198 |
| 2007/0099365 A1* | 5/2007 | Lim | H01L 21/28061 438/197 |
| 2008/0237726 A1* | 10/2008 | Dyer | H01L 21/823807 257/369 |
| 2008/0283897 A1* | 11/2008 | Ding | H01L 21/28061 257/316 |
| 2011/0101469 A1 | 5/2011 | Kronholz et al. | |
| 2012/0217573 A1 | 8/2012 | Kang | |
| 2013/0228871 A1* | 9/2013 | Huang | H01L 27/088 257/368 |
| 2013/0302976 A1* | 11/2013 | Tsai | H01L 21/283 438/589 |
| 2014/0070285 A1* | 3/2014 | Xie | H01L 29/66545 257/288 |
| 2014/0134841 A1* | 5/2014 | Sipani | H01L 21/76802 438/675 |
| 2015/0145073 A1* | 5/2015 | Lee | H01L 29/6656 257/411 |

* cited by examiner

*Primary Examiner* — Charles Garber
*Assistant Examiner* — Alia Sabur
(74) *Attorney, Agent, or Firm* — Scully, Scott, Murphy & Presser, P.C.; Steven J. Meyers

(57) ABSTRACT

A robust gate spacer that can resist a long overetch that is required to form gate spacers in fin field effect transistors (FinFETs) and a method of forming the same are provided. The gate spacer includes a first gate spacer adjacent sidewalls of at least one hard mask and a top portion of sacrificial gate material of a sacrificial gate structure and a second gate spacer located beneath the first gate spacer and adjacent remaining portions of sidewalls of the sacrificial gate material. The first gate spacers is composed of a material having a high etch resistance that is not prone to material loss during subsequent exposure to dry or wet etch chemicals employed to form the second gate spacer and to remove the hard mask.

20 Claims, 7 Drawing Sheets

METHOD AND STRUCTURE FOR ROBUST FINFET REPLACEMENT METAL GATE INTEGRATION

BACKGROUND

The present disclosure relates to semiconductor device fabrication, and more particularly to a method of forming a gate spacer that can resist a long overetch that is required to form the gate spacers in fin field effect transistors (FinFETs) during a replacement gate scheme.

Field-effect transistors (FETs) generate an electric field by a gate structure to control the conductivity of a channel between a source region and a drain region in a semiconductor substrate. The gate of a finFET, and in some non-finFETs, may be formed by a replacement gate process in which a sacrificial gate, typically made of polysilicon, is removed to form a gate cavity, and gate materials replace the removed sacrificial gate material in the gate cavity.

During the fabrication of the FETs, the sacrificial gate is exposed to various etchants and cleaning chemistries. To protect the sacrificial gate, a spacer material is conformally applied to the sacrificial gate and then partially removed to form a gate spacer on a sidewall of the sacrificial gate. A problem arises in the prior art spacer formation in finFETs because the spacer etch in FinFETs has a huge build-in overetch budge in order to clear spacer material from fin sidewalls. This overetch that clears the sidewalls of fins also consumes the spacer material on the sidewalls of the sacrificial gate, which in turn, exposes polysilicon from the sacrificial gate at the polysilicon line ends. If polysilicon is exposed, epitaxial growth will also occur on the sacrificial gate. The uncontrolled epitaxial growth on the sacrificial gate can cause shorts of the polysilicon-polysilicon and polysilicon-contact. As such, a method to form a robust gate spacer that can resist the long overetch process in FinFETs is needed.

SUMMARY

The present disclosure provides a robust gate spacer that can resist a long overetch that is required to form gate spacers in fin field effect transistors (FinFETs) and a method of forming the same. The gate spacer includes a first gate spacer adjacent sidewalls of at least one hard mask and a top portion of sacrificial gate material of a sacrificial gate structure and a second gate spacer located beneath the first gate spacer and adjacent remaining portions of sidewalls of the sacrificial gate material. The first gate spacer is composed of a material having a high etch resistance that is not prone to material loss during subsequent exposure to dry or wet etch chemicals employed to form the second gate spacer, thus eliminating the possibility of exposing the sacrificial gate material from the sacrificial gate structure. The high etch resistance of the first gate spacer also presents spacer divot formation during subsequent removal of the at least one hard mask and erosion of the gate spacer during subsequent gate cap formation process.

In one aspect of the present disclosure, a method of forming a semiconductor structure is provided. The method includes forming at least one sacrificial gate structure over a portion of at least one semiconductor fin formed on a substrate. The at least one sacrificial gate structure includes a sacrificial gate material and at least one hard mask atop the sacrificial gate material. An interlevel dielectric (ILD) layer is then formed over the at least one sacrificial gate structure, the at least one semiconductor fin and the substrate. Next, the ILD layer is recessed to expose the at least one hard mask and a top portion of the sacrificial gate material. After forming a first gate spacer on sidewalls of the at least one hard mask and the top portion of the sacrificial gate material, a remaining portion of the ILD layer is removed to expose a remaining portion of the sacrificial gate material. A second gate spacer is formed on sidewalls of the remaining portion of the sacrificial gate material.

In another aspect of the present disclosure, a semiconductor structure is provided. The semiconductor structure includes at least one fin structure present on a substrate, at least one gate structure present over a channel portion of the at least one fin structure, a first gate spacer present on sidewalls of an upper portion of the at least one gate structure, a second gate spacer present underneath the first gate spacer, and an epitaxial source region and an epitaxial drain region on opposite sides of the at least gate structure adjacent the second gate spacer. The gate structure includes a U-shaped gate dielectric, a gate electrode present on a bottom and sidewalls of the U-shaped gate dielectric, and a gate cap atop the U-shaped gate dielectric and the gate electrode. The first gate spacer is in contact with an entirety of the gate cap and an upper portion of vertical portions of the U-shaped gate dielectric. The second gate spacer is in contact with a remaining portion of the vertical portions of the U-shaped gate dielectric. The first gate spacer includes a material having a higher etch resistance than the second gate spacer.

DETAILED DESCRIPTION

Figure 1:
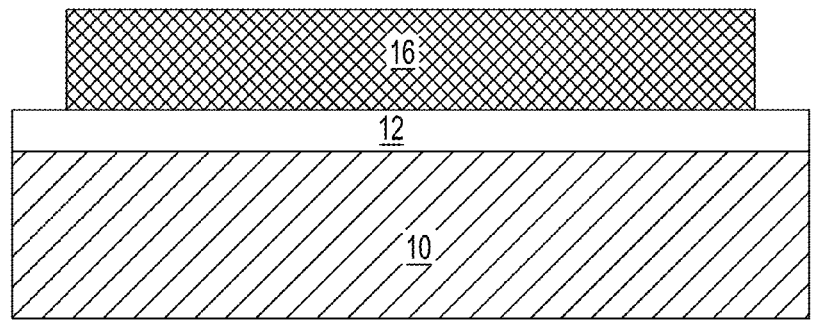
FIG. 1 is a cross-sectional view of an exemplary semiconductor structure including a substrate and at least one semiconductor fins formed thereon.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

Referring to FIG. 1, there is illustrated an exemplary semiconductor structure that can be employed according to an embodiment of the present disclosure. Specifically, the semiconductor structure includes a substrate having at least one semiconductor fin 16 formed thereon. In some embodiments of the present disclosure, the at least one semiconductor fin 16 can be formed by patterning a top semiconductor layer of a semiconductor-on-insulator (SOI) substrate. In other embodiments, the at least one semiconductor fin 16 can be formed by patterning an upper portion of a bulk semiconductor substrate.

In one embodiment of the present disclosure and as shown in FIG. 1, the substrate is a SOI substrate including a handle substrate 10, a buried insulator layer 12 and a top semiconductor layer (not shown) from which the at least one semiconductor fin 16 is formed.

In some embodiments of the present disclosure, the handle substrate 10 can include a semiconductor material, such as, for example, Si, Ge, SiGe, SiC, SiGeC, and III/V compound semiconductors. In other embodiments, the handle substrate 10 may be a dielectric material or a conductive material. In further embodiments, the handle substrate 10 can be omitted. When present, the handle substrate 10 provides mechanical support to the buried insulator layer 12 and the top semiconductor layer. The thickness of the handle substrate 10 can be from 30 μm to about 2 mm, although less and greater thicknesses can also be employed.

The buried insulator layer 12 includes a dielectric material such as silicon oxide, silicon nitride, silicon oxynitride, or a combination thereof. The thickness of the buried insulator layer 12 can be from 50 nm to 200 nm, with a thickness from 100 nm to 150 nm being more typical.

The top semiconductor layer can include a semiconductor material such as, for example, Si, Ge, SiGe, SiC, SiGeC, and III/V compound semiconductors such as, for example, InAs, GaAs, and InP. The semiconductor materials of the top semiconductor layer and the handle substrate 10 may be the same or different. Typically, each of the handle substrate 10 and the top semiconductor layer comprises a single crystalline semiconductor material, such as, for example, single crystalline silicon. The top semiconductor layer may or may not be doped with p-type dopants and/or n-type dopants. Examples of p-type dopants include, but are not limited to, boron, aluminum, gallium and indium. Examples of n-type dopants, include but are not limited to, antimony, arsenic and phosphorous. The thickness of the top semiconductor layer can be from 10 nm to 200 nm, with a thickness from 30 nm to 70 nm being more typical.

In another embodiment of the present disclosure, the substrate is a bulk semiconductor substrate (no shown). When a bulk semiconductor substrate is employed as semiconductor substrate, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor substrate. In some embodiments, the bulk semiconductor substrate comprises a single crystalline semiconductor material, such as, for example, single crystalline silicon. In other embodiments, the bulk semiconductor substrate may comprise a polycrystalline or amorphous semiconductor material.

In some embodiments of the present disclosure, a hard mask layer (not shown) can be formed on the top semiconductor layer prior to forming the semiconductor fins 16. During the subsequent formation of the at least one semiconductor fin 16, a portion of the hard mask layer provides a fin cap on a top surface of the at least one semiconductor fin 16. In such a structure, at least one sacrificial gate structure to be subsequently formed is present only along the vertical sidewalls of the at least one semiconductor fin 16. In the embodiment that is illustrated, no fin cap is present, and, as such, each sacrificial gate structure is present along the vertical sidewalls and on a top surface of the at least one semiconductor fin 16.

When employed, the hard mask layer may comprise an oxide, nitride, oxynitride or any combination thereof including multilayers. In one embodiment, the hard mask layer includes silicon oxide or silicon nitride. The hard mask layer can be formed utilizing a conventional deposition process such as, for example, chemical vapor deposition (CVD), plasma enhanced chemical vapor deposition (PECVD), chemical solution deposition, evaporation or other like deposition processes. Alternatively, the hard mask layer can be formed by a thermal process such as, for example, oxidation or nitridation of the top semiconductor layer. Any combination of the above mentioned processes can also be used in forming the hard mask layer. The hard mask layer that is formed can have a thickness from 20 nm to 80 nm, with a thickness from 30 nm to 60 nm being more typical.

The semiconductor fins 16 can be formed by lithography and etching of the top semiconductor layer of the SOI substrate. The lithographic step includes applying a photoresist layer (not shown) atop the top semiconductor layer, exposing the photoresist layer to a desired pattern of radiation, and developing the exposed photoresist layer utilizing a conventional resist developer. The etching process may comprise a dry etching process, a wet chemical etching process or a combination thereof. Suitable dry etching processes that can be used in the present disclosure include, but are not limited to, reactive ion etching, ion beam etching, plasma etching or laser ablation. Typically, a RIE process or an ion beam etching process is used. The etching process transfers the pattern from the patterned photoresist layer to the top semiconductor layer or first to the hard mask layer when present and thereafter to the underlying top semiconductor layer utilizing the buried insulator layer 12 as an etch stop. After transferring the pattern into the top semiconductor layer, the patterned photoresist layer can be removed utilizing a conventional resist stripping process such as, for example, ashing. Remaining portions of the top semiconductor layer after the lithographic patterning constitute the semiconductor fins 16. In the illustrated embodiment of the present disclosure, the semiconductor fin 16 has a bottommost surface that is located on a top surface of the buried insulator layer 12 of the SOI substrate. Alternatively, the semiconductor fins 16 can also be formed utilizing a sidewall image transfer (SIT) process. In a typical SIT process, spacers are formed on a sacrificial mandrel. The sacrificial mandrel is removed and the remaining spacers are used as a hard mask to etch the top semiconductor layer. The spacers are then removed after the semiconductor fins 16 have been formed.

In some embodiments of the present disclosure and when the hard mask layer is present, a portion of the hard mask layer that remains atop each semiconductor fin 16 can be removed at this stage. The removal of the remaining non-etched portion of hard mask layer can be achieved by performing a selective etching process or by utilizing a planarization process such as chemical mechanical planarization (CMP).

Figure 2:
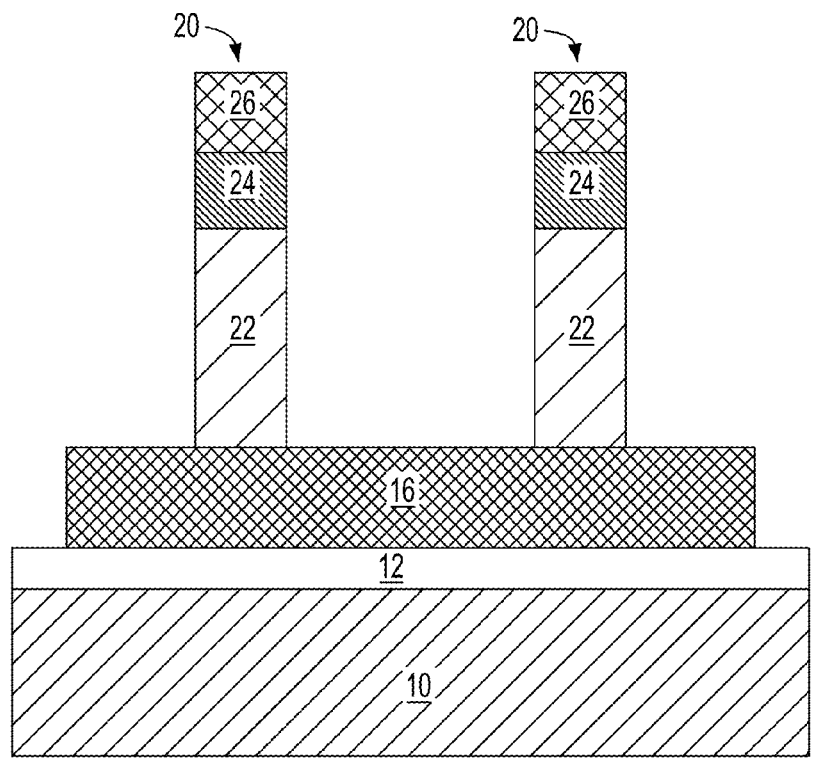
FIG. 2 is a cross-sectional view of the exemplary semiconductor structure of FIG. 1 after forming at least one sacrificial gate structure over a channel portion of the at least one semiconductor fin.

Referring to FIG. 2, at least one sacrificial gate structure 20 is formed over a channel portion of the at least one semiconductor fin 16. In the illustrated embodiment of the present disclosure, a pair of sacrificial gate structures 20 is shown and each sacrificial structure 20 includes, from bottom to top, a sacrificial gate material 22, a first hard mask 24 and a second hard mask 26. The term "sacrificial gate structure" as used herein refers to a placeholder structure for a functional gate structure to be subsequently formed. The term "functional gate structure" as used herein refers to a permanent gate structure used to control output current (i.e., flow of carriers in the channel) of a semiconducting device through electrical fields.

The sacrificial gate structures 20 can be formed by first forming a material stack on the substrate. The material stack can include a sacrificial gate material layer (not shown) present on the substrate and the semiconductor fins 16, a first hard mask layer present (not shown) on the sacrificial gate material layer and a second hard mask layer (not shown) present on the first hard mask layer.

The sacrificial gate material layer may be composed of a semiconductor material that can be etched selectively to a material of the semiconductor fins 16. Exemplary semiconductor materials that can be employed in the sacrificial gate material layer include, but are not limited to, silicon, germanium, a silicon germanium alloy, a silicon carbon alloy, or a compound semiconductor material. In one embodiment, the sacrificial gate material layer is composed of polysilicon. The sacrificial gate material layer can be formed using CVD or PECVD. The thickness of the sacrificial gate material layer, as measured above an upper surface of the semiconductor fin 16, can be from 50 nm to 300 nm, although lesser and greater thicknesses can also be employed.

The first hard mask layer may be composed of a nitride, such as, for example silicon nitride silicon oxynitride, silicon boron nitride or silicon carbon nitride. The first hard mask layer can be formed using CVD, physical vapor deposition (PVD), thermal growth methods, or a combination thereof. The thickness of the first hard mask layer can be from 10 nm to 50 nm, although lesser and greater thicknesses can also be employed.

The second hard mask layer, which differs in composition from the first hard mask layer, may be composed of an oxide, such as, for example, silicon oxide. The second hard mask layer can be formed using CVD or PVD. The thickness of the second hard mask layer can be from 10 nm to 50 nm, although lesser and greater thicknesses can also be employed.

The material stack is subsequently lithographically patterned and etched to provide the sacrificial gate structures 20. Specifically, a pattern is produced by applying a photoresist over the second hard mask layer, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process. The remaining portions of the second hard mask layer function as an etch mask to remove the exposed portions of the first hard mask layer and the underlying sacrificial gate electrode material layer. In one embodiment, the etch process that forms the sacrificial gate structures 20 is an anisotropic etch including, but not limited to, RIE, ion bean etching, plasma etching and laser ablation.

Each remaining portion of the sacrificial gate material constitutes a sacrificial gate material 22, each remaining portion of the first hard mask layer constitutes a first hard mask 24, and each remaining portion of the second hard mask layer constitutes a second hard mask 26.

Figure 3:
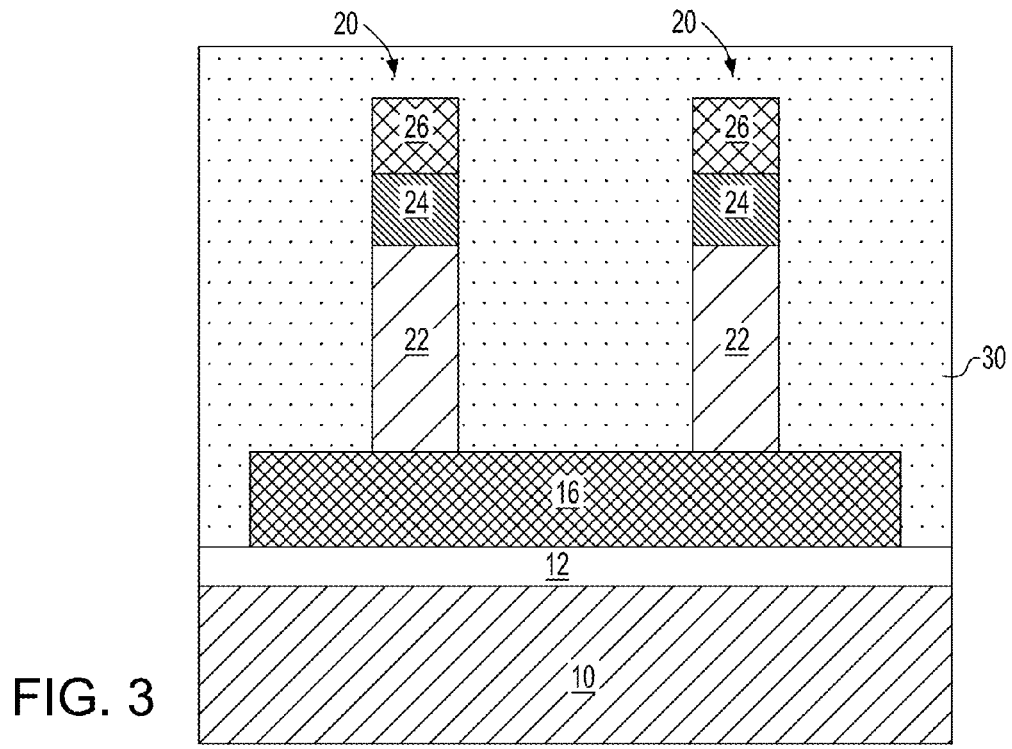
FIG. 3 is a cross-sectional view of the exemplary semiconductor structure of FIG. 2 after forming an interlevel dielectric (ILD) layer over the at least one sacrificial gate structure, the at least one semiconductor fin and the substrate.

Referring to FIG. 3, an interlevel dielectric (ILD) layer 30 is formed over the sacrificial gate structures 20, the semiconductor fins 16 and the exposed surface of the buried insulator layer 12. The ILD layer 30 can include a flowable oxide, such as, for example, a polymer hydrogen silsesquioxane (HSQ) or a carbon doped silicon oxide. In the illustrated embodiment and as shown in FIG. 3, the flowable oxide fills the space between the sacrificial gate structures 20. Alternatively, an organic dielectric including amorphous carbon can also be employed to form the ILD layer 30. The ILD layer 30 can be formed by PECVD or spin coating. Following the deposition of the ILD layer 30, the ILD layer 30 can be subsequently planarized, for example, by CMP using a top surface of the second hard mask 26 as an etch stop so that a top surface of the ILD layer 30 is coplanar with the top surface of the second hard mask 26.

Figure 4:
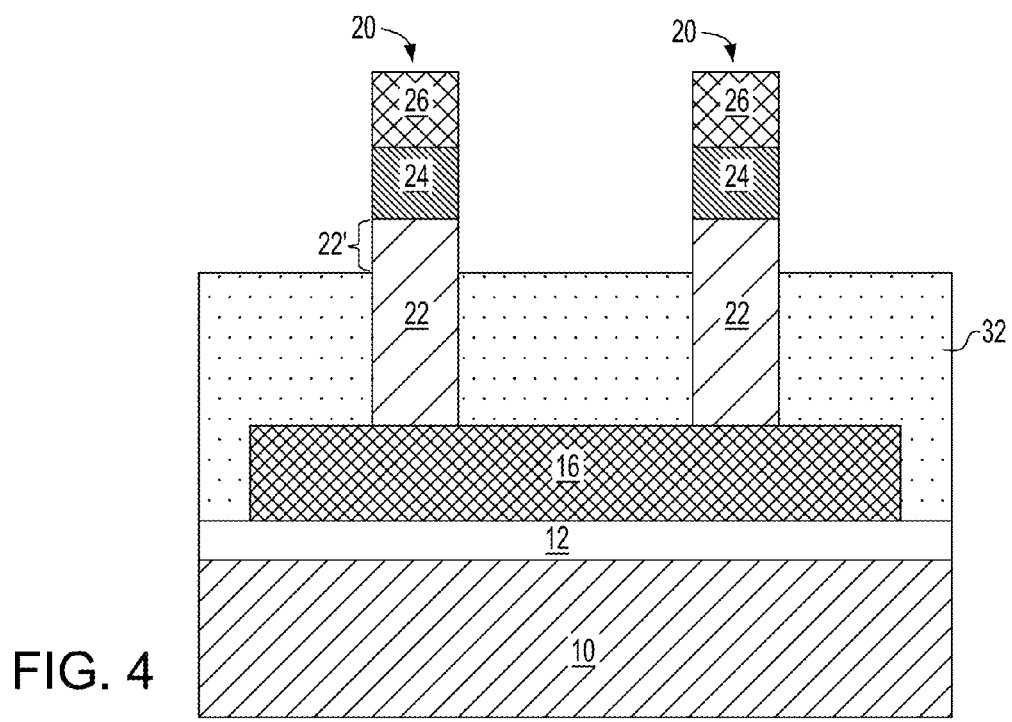
FIG. 4 is a cross-sectional view of the exemplary semiconductor structure of FIG. 3 after recessing the ILD layer below a top surface of the sacrificial gate material.

Referring to FIG. 4, the ILD layer 30 is recessed below a top surface of the sacrificial gate material 22. An etch back process can be performed to recess the ILD layer 30 until a top portion 22' of the sacrificial gate material 22 is exposed. The etch back process can be a dry etch such as, for example, an advanced isotropic dry cleaning including SICONI (in situ pre Ni silicide) cleaning or COR (chemical oxide removal), or a wet chemical etch which may employ an aqueous solution containing hydrofluoric acid (HF). The top portion 22' of the sacrificial gate material 22 that is exposed after the etch back process has a height no more than 20 nm as measured from the top surface of the sacrificial gate material 22. A remaining portion of the ILD layer 30 is herein referred to as ILD layer portion 32. In each sacrificial gate structure 20, the total height of the second hard mask 26, the first hardmask 24 and the top portion 22' of the sacrificial gate material 22 determines a height of a first gate spacer subsequently formed, while the height of a portion of the sacrificial gate material 22 that remains covered by the ILD layer portion 32 determines a height of a second gate spacer subsequently formed.

Figure 5:
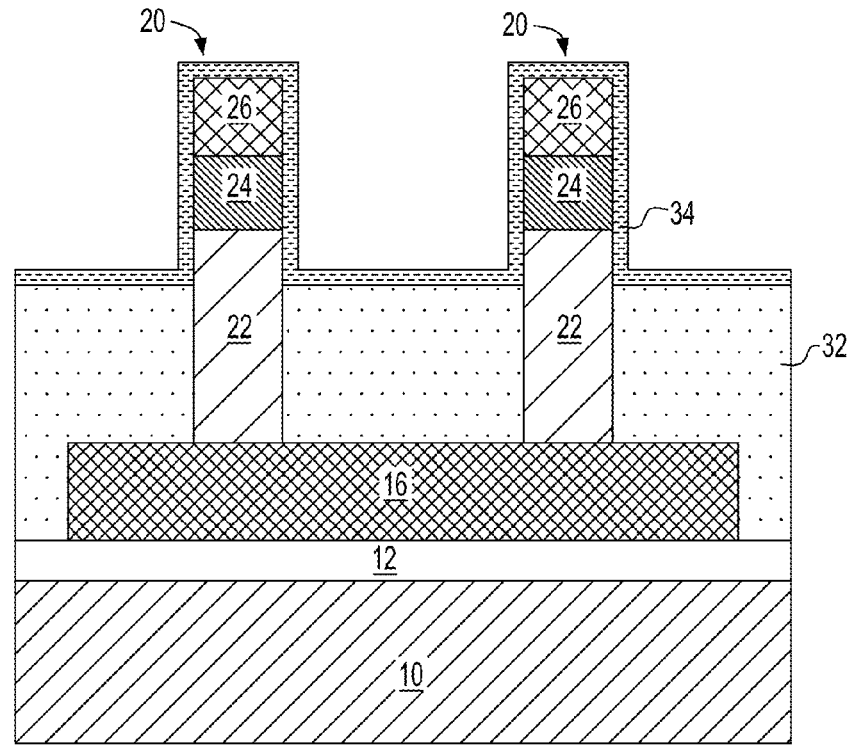
FIG. 5 is a cross-sectional view of the exemplary semiconductor structure of FIG. 4 after forming a first gate spacer material layer on exposed surfaces of the at least one sacrificial gate structure and a ILD layer portion.

Referring to FIG. 5, a first spacer material layer 34 is formed on exposed surfaces of the sacrificial gate structures 20 and the ILD layer portion 32. The first spacer material layer 34 typically includes a material with a high etch resistance that is not prone to material loss during subsequent exposures to dry or wet etch chemicals employed to form a second gate spacer as well as to remove the first hard mask 24 in the sacrificial gate structure 20. In one embodiment, the first spacer material layer 34 may comprise a high-k material. By "high-k material" it is meant a dielectric material having a dielectric constant greater than 3.9. Examples of high-k materials include, but are not limited to, hafnium oxide, hafnium silicate, zirconium oxide, zirconium silicate aluminum oxide, or tantalum oxide. The first spacer material layer 34 may be conformally deposited utilizing CVD, PECVD or atomic layer deposition (ALD). The thickness of the first spacer material layer 34 can be from 1 nm to 10 m, with a thickness ranging from 1 nm to 5 nm being more typical. In one embodiment, and when the first spacer material layer 34 is composed of a high-k material, after the deposition of the high-k material, the first spacer layer 34 is annealed to crystallize the high-k material. The crystallization of the high-k material tends to increase the etch resistance of the first spacer material layer 34.

Figure 6:
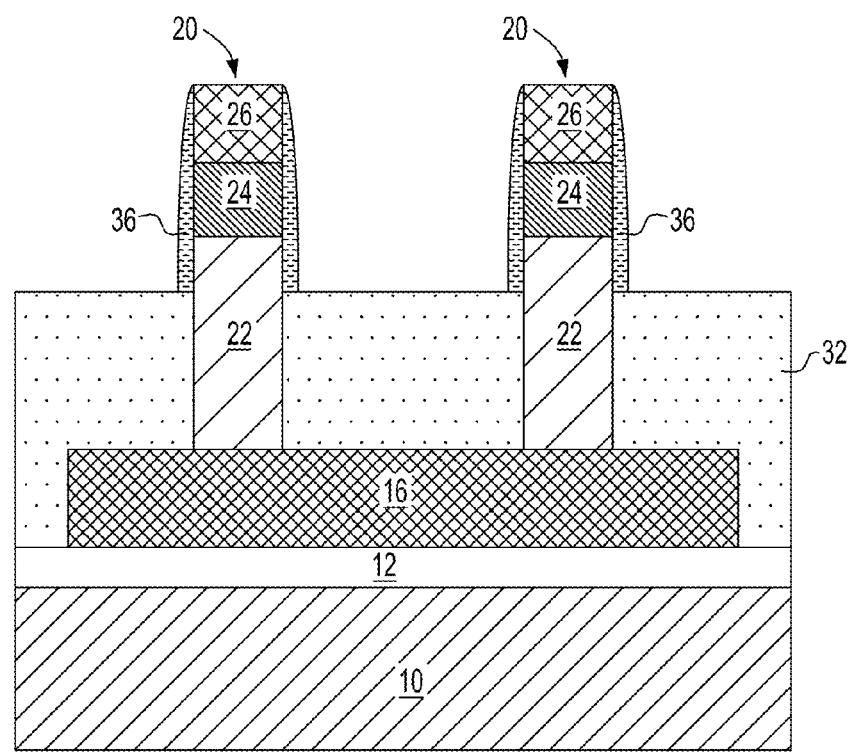
FIG. 6 is a cross-sectional view of the exemplary semiconductor structure of FIG. 5 after forming a first gate spacer on upper portions of sidewalls of the at least one sacrificial gate structure.

Referring to FIG. 6, horizontal portions of the first spacer material layer 34 are removed by an anisotropic etch, such as, for example, RIE to provide a first gate spacer 36 located on sidewalls of an upper portion of the sacrificial gate structures 20 (i.e., sidewalls of the second hard mask 26, the first hard mask 24 and the top portion 22' of the sacrificial gate material 22). In one embodiment of the present application, the first gate spacer 36 may have a width less than 5 nm.

Figure 7:
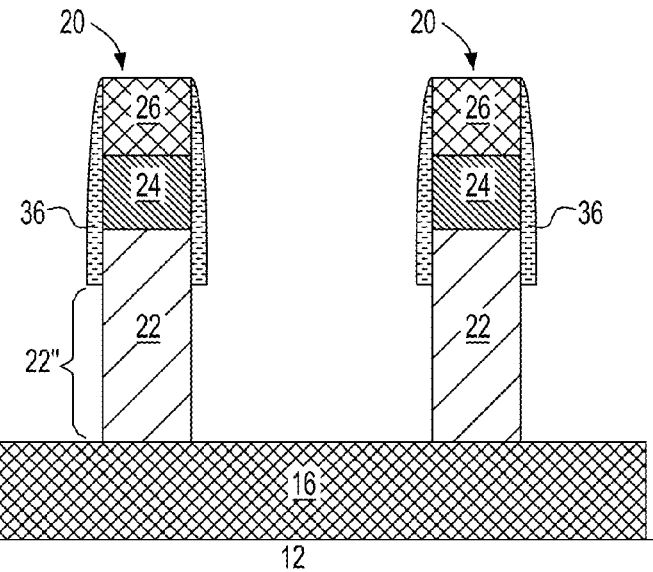
FIG. 7 is a cross-sectional view of the exemplary semiconductor structure of FIG. 6 after removing the ILD layer portion.

Referring to FIG. 7, the ILD layer portion 34 is removed using an isotropic etch, such as, for example, SICONI, COR, or a diluted HF solution. Remaining portions 22" of the sacrificial gate structure 20 (i.e., portions of the sacrificial gate material 22 that were previously covered by the ILD layer portion 32) are thus exposed.

Figure 8:
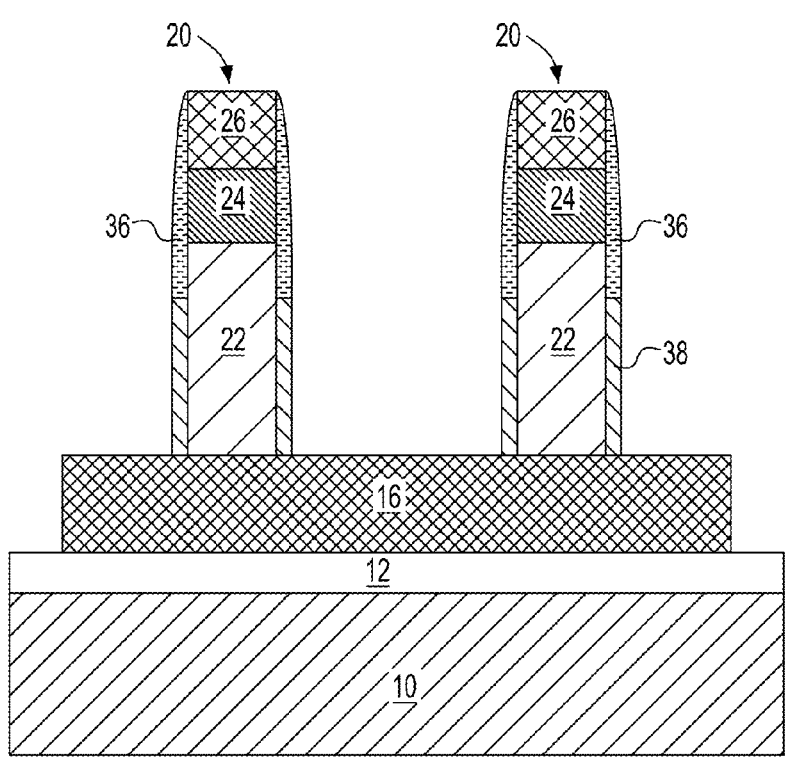
FIG. 8 is a cross-sectional view of the exemplary semiconductor structure of FIG. 7 after forming a second gate spacer on portions of sidewalls of the at least one sacrificial gate structure that are not covered by the first gate spacer.

Referring to FIG. 8, a second gate spacer 38 is then formed on sidewalls of the remaining portions 22" of the sacrificial gate structures 20. The second gate spacer 38 can be formed by first forming a second gate spacer material layer (not shown) on exposed surfaces of the sacrificial gate structures 20, the first gate spacer 36, the semiconductor fins 16 and the buried insulator layer 12. The second gate spacer material layer can be conformally formed by using conventional deposition techniques, such as CVD or ALD. The second gate spacer material layer includes a dielectric material (different from the one used in providing the first gate spacer) that has a lower etch resistance than that of the material of the first gate spacer 36. In some embodiments of the present disclosure, the second gate spacer material layer is composed of a dielectric nitride, such as, for example, silicon nitride, silicon oxynitride, silicon boron nitride or silicon carbon nitride.

Portions of the second spacer material layer that are not covered by the first gate spacer 36 are subsequently removed utilizing an anisotropic etch, such as, for example, a RIE process. Remaining portions of the second spacer material layer that are located beneath the first gate spacer 36 constitute a second gate spacer 38. The second gate spacer 38 that is formed has a width no greater than that of the first gate spacer 36. In one embodiment and as shown in FIG. 8, the first gate spacer 36 and the second gate spacer 38 have a same width so that an outer sidewall of the second gate spacer 38 is vertically coincident with an outer sidewall of the first gate spacer 36. Due to the higher etch resistance of the first gate spacer material, the first gate spacer 36 is not affected by the spacer etch process that is employed in forming the second gate spacer, thus effectively preventing the exposure of portions of the sacrificial gate material 22 proximate to the interface between the first hard mask 24 and the sacrificial gate material 22.

Figure 9:
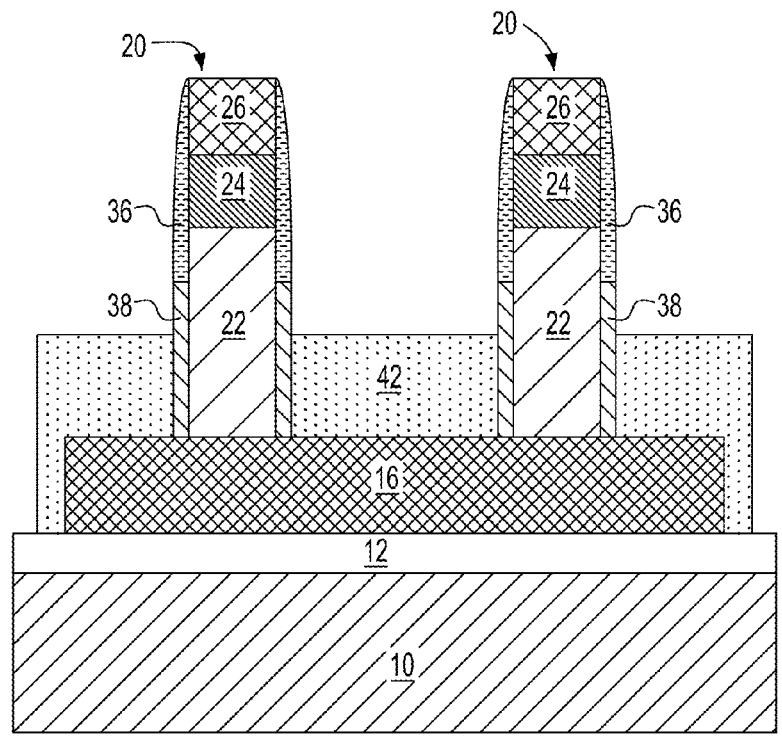
FIG. 9 is a cross-sectional view of the exemplary semiconductor structure of FIG. 8 after forming a source region and a drain region on opposite sides of the at least one sacrificial gate structure.

Referring to FIG. 9, a source region and a drain region (collectively referred to as source/drain regions 42) are formed on opposite sides of each sacrificial gate structure 20. The source/drain regions 42 can be formed by epitaxially depositing a semiconductor material over the exposed surfaces of semiconductor fins 16, but not on dielectric surfaces such as surfaces of the second hard mask 26, the first gate spacer 36, the second gate spacer 38 and the buried insulator layer 12. The epitaxially deposited semiconductor material merges individual semiconductor fin 16 together to lower the source/drain resistance.

Prior to the epitaxial deposition of the semiconductor material, a series of wet cleans, dry cleans or other physical cleaning techniques may be performed to remove contaminants including resist residues and any remaining oxides from the exposed surfaces of the semiconductor fins 16. During the pre-epitaxial clean processes, the second hardmask layer 26 may be etched due to lack of etch resistance. However, the first gate spacer 38 is not affected due to the high etch resistance of the first gate spacer material.

The epitaxial grown of the semiconductor material can be effected by placing the semiconductor structure shown in FIG. 8 into a reaction chamber, and simultaneously, or alternately, flowing at least one reactant gas (such as $SiH_4$, $Si_2H_6$, $SiH_2Cl_2$, $GeH_4$, $C_2H_2$, $C_2H_4$) and an etchant gas (such as HCl) into the reaction chamber. Optionally, a carrier gas such as $H_2$, $N_2$, $H_2$, and/or Ar can be flowed into the reaction chamber. The temperature for epitaxial deposition typically ranges from 550° C. to 1300° C. The apparatus for performing the epitaxial growth may include a CVD apparatus, such as atmospheric pressure CVD (APCVD), low pressure CVD (LPCVD) and PECVD.

The semiconductor material that can be epitaxially deposited includes any semiconductor material such as, for example, Si, SiGe and Si:C. In one embodiment, when the semiconductor structure of the present disclosure is a p-type FinET, the source and drain regions 42 are comprised of SiGe. In another embodiment, when the semiconductor structure of the present disclosure is an n-type FinET, the source and drain regions 42 are comprised of Si or Si:C.

The semiconductor material of the source and drain regions 42 can be deposited as an intrinsic semiconductor material, or can be deposited with in-situ doping. If the semiconductor material is deposited as an intrinsic semiconductor material, the source and drain regions 42 can be subsequently doped (ex-situ) utilizing ion implantation, gas phase doping or dopant out diffusion from a sacrificial dopant source material. For a p-type FinET, the source and drain regions 42 are doped with a p-type dopant and for an n-type FinFET, the source and drain regions 42 are doped with an n-type dopant. The p-type dopants or n-type dopants can be activated subsequently using a rapid thermal process.

Figure 10:
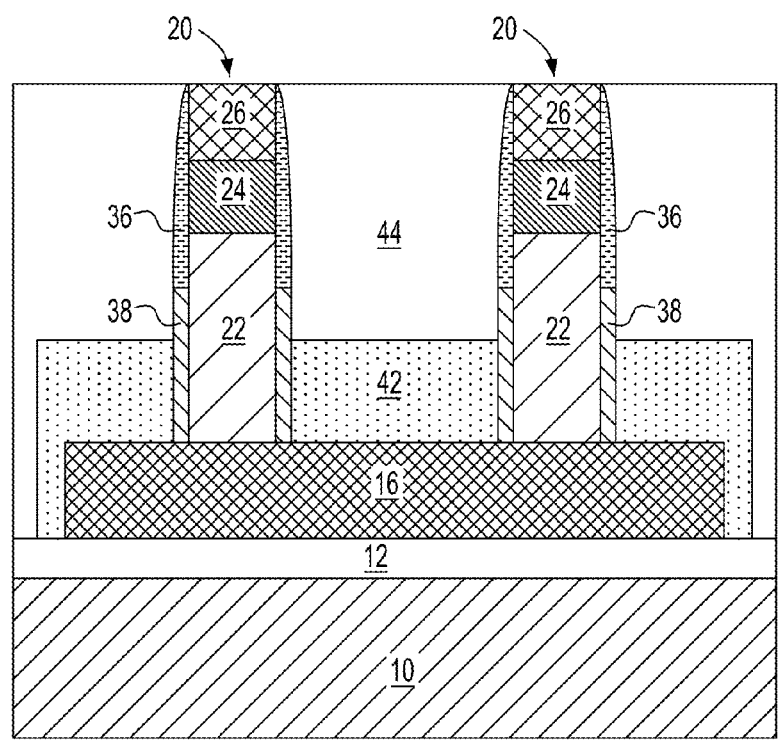
FIG. 10 is a cross-sectional view of the exemplary semiconductor structure of FIG. 9 after forming a second ILD layer over the at least one sacrificial gate structure, the first gate spacer, the source/drain regions and the substrate.

Referring to FIG. 10, a second ILD layer 44 is formed over the sacrificial gate structures 20, the first gate spacer 36, the source/drain regions 42 and the exposed portions of the buried insulator layer 12. The second ILD layer 44 can be composed of a same material as that of the ILD layer 30 and can be formed using the same or similar process described above for forming the ILD layer 30 in FIG. 3. The thickness of the second ILD layer 44 can be selected so that an entirety of a top surface of the second ILD layer 44 is formed above the top surface of the second hard mask 26. The second ILD layer 44 can be subsequently planarized, for example, by CMP and/or a recess etch using the second hard mask 26 as an etch stop.

Figure 11:
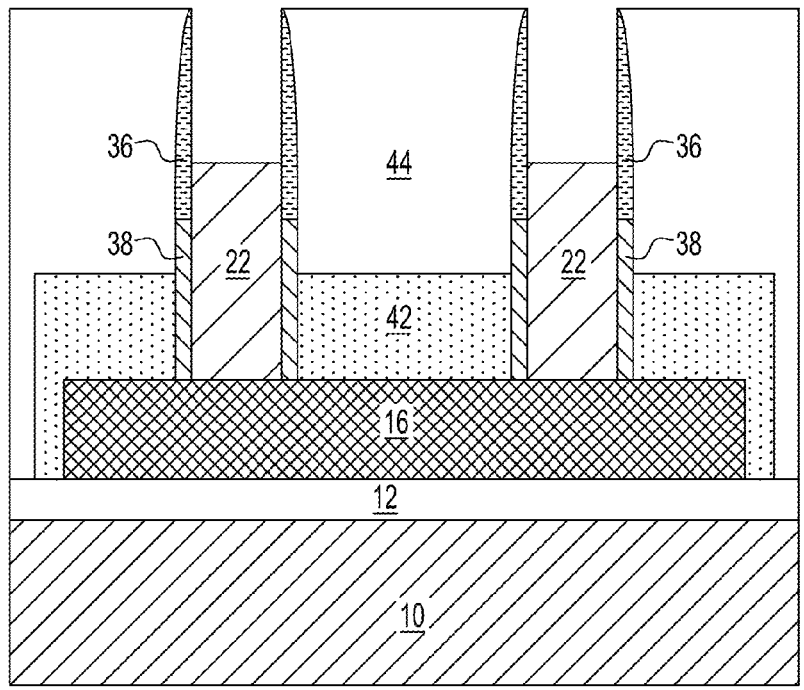
FIG. 11 is a cross-sectional view of the exemplary semiconductor structure of FIG. 10 after removing the first hard mask and the second hard mask from the at least one sacrificial gate structure.

Referring to FIG. 11, the second hard mask 26 and the first hard mask 24 are removed sequentially by using a dry etch or a wet chemical etch selective to the sacrificial gate material 22. After removing the second hard mask 26 and the first hard mask 24, the top surface of the sacrificial gate material 22 is physically exposed. Because the first gate spacer material has a higher etch resistance than that of the first hard mask 24, the etch chemistry used to remove the first hard mask 24 does not attack the first gate spacer 36 and no divots can be formed at the edge of the inner sidewall surfaces of the first gate spacer 36 bordering the sacrificial gate material 22 during the removal of the first hard mask 24.

Figure 12:
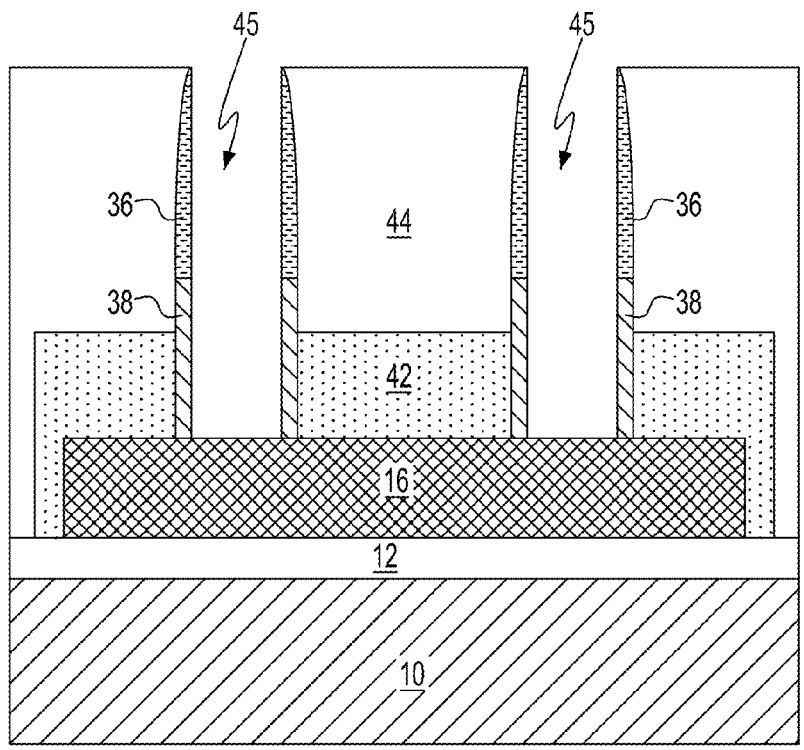
FIG. 12 is a cross-sectional view of the exemplary semiconductor structure of FIG. 11 after removing the sacrificial gate material from the at least one sacrificial gate structure to provide at least one gate cavity.

Referring to FIG. 12, the sacrificial gate material 22 is removed to provide at least one gate cavity 45. The sacrificial gate material 22 can be removed using a wet chemical etch or a dry etch selective to the semiconductor fins 16, the second ILD layer 44, the first gate spacer 36 and the second gate spacer 38. In one embodiment and when the sacrificial gate material 22 is composed of polysilicon, the sacrificial gate material 22 can be removed using a silicon-specific RIE process. A gate cavity 45 is thus formed within a volume from which each sacrificial gate structure 20 is removed and is laterally confined by inner sidewalls of the first gate spacer 36 and the second gate spacer 38. Further, portions the semiconductor fins 16 that are previously covered by the sacrificial gate structures 20 can be exposed at the bottom of each gate cavity 45.

Figure 13:
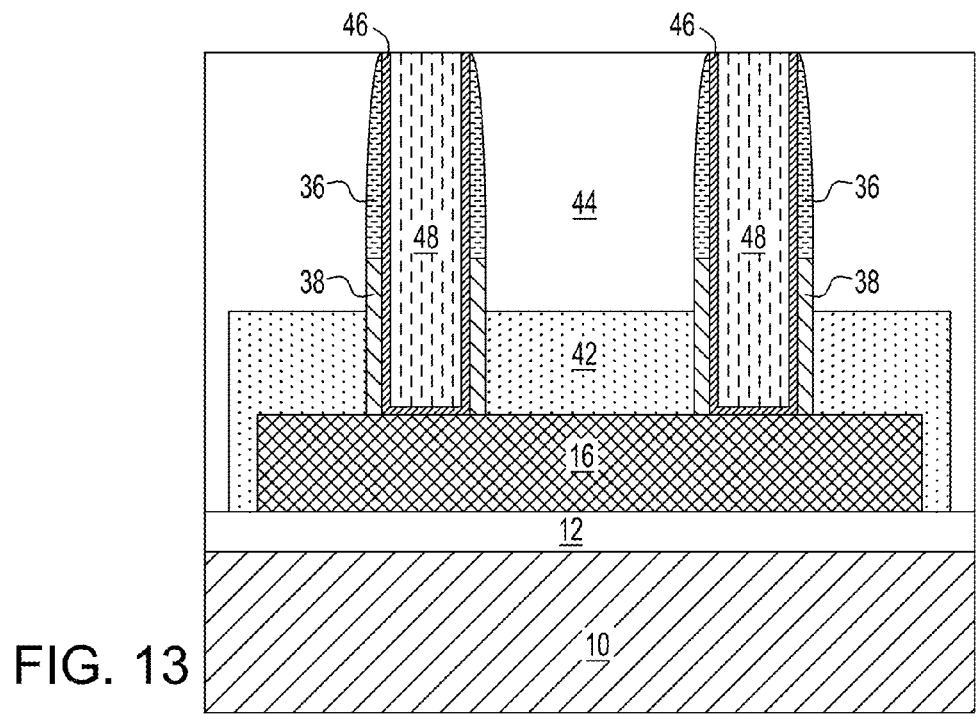
FIG. 13 is a cross-sectional view of the exemplary semiconductor structure of FIG. 12 after forming a gate dielectric and a gate electrode within the at least one gate cavity.

Referring to FIG. 13, a gate dielectric 46 and a gate electrode 48 are formed subsequently within the gate cavity 45.

The gate dielectric 46 can be formed on the bottom and sidewalls of each gate cavity 45. The gate dielectric 46 can be formed as a conformal layer, for example, by deposition of a dielectric material by CVD or ALD. In one embodiment, the gate dielectric 46 is composed of a high-k material. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

The gate electrode 48 can be formed by filling remaining portions of the gate cavity 45 with at least one conductive material such as at least one metallic material and/or at least one doped semiconductor material. Examples of the conductive metal include, but are not limited to, Al, W, Cu, Pt, Ag, Au, Ru, Ir, Rh and Re, alloys of a conductive metal, e.g., Al—Cu, metal nitrides or carbides such as AlN, TiN, TaN, TiC and TaC, silicides of a conductive metal, e.g., W silicide, and Pt silicide, and combinations thereof. The gate electrode 48 can be formed by depositing the conductive material utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, and chemical solution deposition. The portion of the at least one conductive material above the top surface of the second ILD layer 44 can be removed, for example, by CMP. The portion of the gate dielectric 48, if formed above the top surface of the second ILD layer 44, may also be subsequently removed.

Figure 14:
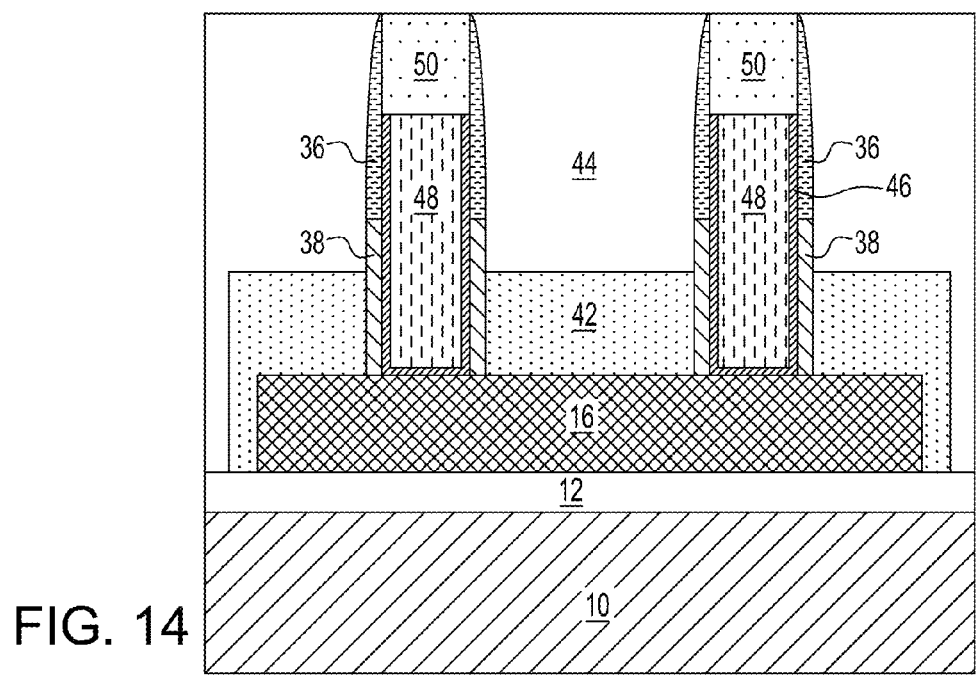
FIG. 14 is a cross-sectional view of the exemplary semiconductor structure of FIG. 13 after recessing the gate dielectric and the gate electrode and forming a gate cap atop the gate dielectric and the gate electrode.

Referring to FIG. 14, the gate electrode 48 may be recessed, followed by a recess of the gate dielectric 46. The recess of the gate electrode 48 and the gate dielectric 46 can be accomplished by dry etch or wet chemical etch. The depth of the recess as measured from top surfaces of the a remaining portion of the gate electrode 48 and a remaining portion of the gate dielectric 46 is less than the height of the first gate spacer 36. The high resistance of the first gate spacer material prevents erosion of the first gate spacer 36 during the recessing etch of the gate dielectric 46 and the gate electrode 48. The remaining portion of the gate electrode 48 and the remaining portion of the gate dielectric 46 together define a functional gate structure. A gate cap material is then deposited over the function gate structure and polished to form a gate cap 50 over each functional gate structure. The gate cap 50 isolates the functional gate structure from a source/drain contact. Exemplary gate cap materials include, but are not limited to, silicon nitride, silicon carbide nitride, or silicon boron carbon nitride. The deposition of the gate cap material can be performed utilizing a conventional deposition process such as, for example, CVD or PECVD. Following the deposition of the gate cap material, the deposited gate cap material can be subsequently planarized, for example, by CMP using a top surface of the second ILD layer 44 as an etch stop.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
   forming at least one sacrificial gate structure over a portion of at least one semiconductor fin formed on a substrate, the at least one sacrificial gate structure comprising a sacrificial gate material and at least one hard mask atop the sacrificial gate material;
   forming an interlevel dielectric (ILD) layer over the at least one sacrificial gate structure, the at least one semiconductor fin and the substrate;
   recessing the ILD layer to expose the at least one hard mask and a top portion of the sacrificial gate material;
   forming a first gate spacer on sidewalls of the at least one hard mask and the top portion of the sacrificial gate material;
   removing a remaining portion of the ILD layer to expose a remaining portion of the sacrificial gate material; and
   forming a second gate spacer on sidewalls of the remaining portion of the sacrificial gate material.

2. The method of claim 1, wherein a top surface of the remaining portion of the ILD layer is 20 nm below a top surface of the sacrificial gate material.

3. The method of claim 1, wherein the first gate spacer comprises a high-k dielectric material selected from the group consisting of hafnium oxide, hafnium silicate, zirconium oxide, zirconium silicate aluminum oxide and tantalum oxide.

4. The method of claim 1, wherein the second gate spacer comprises a material having a etch resistance lower than a etch resistance of the first gate spacer.

5. The method of claim 4, wherein the second gate spacer comprises a dielectric nitride selected from the group consisting of silicon nitride, silicon oxynitride, silicon boron nitride and silicon carbon nitride.

6. The method of claim 1, wherein the second gate spacer is located beneath a corresponding first gate spacer and has width no greater than a width of the corresponding first gate spacer.

7. The method of claim 1, wherein the ILD layer comprises amorphous carbon or a flowable oxide selected from the group consisting of a polymer hydrogen silsesquioxane (HSQ) and a carbon doped silicon oxide.

8. The method of claim 1, wherein the at least one hard mask comprises a first hard mask present on the sacrificial gate material and a second hard mask present on the first hard mask.

9. The method of claim 8, wherein the first hard mask comprises silicon nitride, silicon oxynitride, silicon boron nitride or silicon carbon nitride, and wherein the second hard mask comprises silicon oxide.

10. The method of claim 1, wherein the forming the first gate spacer comprises:
    forming a conformal first gate spacer material layer on exposed surfaces of the at least one sacrificial gate structure and the remaining portion of the ILD layer; and
    removing horizontal portions of the conformal first spacer material layer.

11. The method of claim 1, wherein the forming the second gate spacer comprises:
    forming a conformal second gate spacer material layer on exposed surfaces of the at least one sacrificial gate structure, the first gate spacer, the at least one fin structure and the substrate; and
    removing portions of the conformal second gate spacer material layer that are not covered by the first gate spacer.

12. The method of claim 1, further comprising forming an epitaxial source region and an epitaxial drain region on portions of the at least one semiconductor fins that are not covered by the sacrificial gate structure and the second gate spacer.

13. The method of claim 12, further comprising removing the at least one sacrificial gate structure to provide at least one gate cavity, wherein the removing the at least one sacrificial gate structure comprise:
    forming another ILD layer over exposed surfaces of the at least one sacrificial gate structure, the first gate spacer, the epitaxial source region, the epitaxial drain region and the substrate, wherein the another ILD layer has an upper surface coplanar with an upper surface of the sacrificial gate structure;
    removing the at least one sacrificial hard mask; and
    removing the sacrificial gate material.

14. The method of claim 13, further comprising forming at least one gate structure in the at least one gate cavity, wherein the forming the at least gate structure comprises:
    forming a gate dielectric on sidewalls and a bottom surface of the gate cavity;
    forming a gate electrode on the gate dielectric to fill a remaining volume of the gate cavity;
    recessing the gate electrode;
    recessing the gate dielectric, the gate dielectric having a top surface coplanar with a top surface of the gate electrode; and
    forming a gate cap on the top surface of the gate dielectric and the top surface of the gate electrode.

15. The method of claim 14, wherein the gate cap is in contact with the first gate spacer and has a bottom surface above an interface between the first gate spacer and the second spacer.

16. A semiconductor structure comprising:
    at least one fin structure present on a substrate;
    at least one gate structure present over a channel portion of the at least one fin structure, the gate structure comprising a U-shaped gate dielectric, a gate electrode present on a bottom and sidewalls of the U-shaped gate dielectric, and a gate cap atop the U-shaped gate dielectric and the gate electrode;
    a first gate spacer present on sidewalls of an upper portion of the at least one gate structure, the first gate spacer in contact with an entirety of the gate cap and an upper portion of vertical portions of the U-shaped gate dielectric;
    a second gate spacer present underneath the first gate spacer, the second gate spacer in contact with a remaining portion of the vertical portions of the U-shaped gate dielectric; and
    an epitaxial source region and an epitaxial drain region on opposite sides of the at least gate structure adjacent the second gate spacer,
    wherein the first gate spacer comprises a material having a higher etch resistance than the second gate spacer.

17. The semiconductor structure of claim 16, wherein the first gate spacer comprises a high-k dielectric material selected from the group consisting of hafnium oxide, hafnium silicate, zirconium oxide, zirconium silicate aluminum oxide and tantalum oxide.

18. The semiconductor structure of claim 16, wherein the second gate spacer comprises a material having a etch resistance lower than a etch resistance of a material of the first gate spacer.

19. The semiconductor structure of claim 18, wherein the second gate spacer comprises a dielectric nitride selected from the group consisting of silicon nitride, silicon oxynitride, silicon boron nitride and silicon carbon nitride.

20. The semiconductor structure of claim 16, wherein the second gate spacer has a width no greater than a width of the first gate spacer.

* * * * *